United States Patent [19]

Oana et al.

[11] 4,447,825

[45] May 8, 1984

[54] III-V GROUP COMPOUND SEMICONDUCTOR LIGHT-EMITTING ELEMENT HAVING A DOPED TANTALUM BARRIER LAYER

[75] Inventors: Yasuhisa Oana, Yokohama; Nobuaki Yasuda, Zushi; Masato Yamashita, Yokohama; Norio Ozawa, Kawasaki, all of Japan

[73] Assignee: Tokyo Shibaura Denki Kabushiki Kaisha, Kawasaki, Japan

[21] Appl. No.: 230,679

[22] Filed: Feb. 2, 1981

[30] Foreign Application Priority Data

Feb. 28, 1980 [JP] Japan ................................. 55-23386
Feb. 28, 1980 [JP] Japan ................................. 55-23387
Feb. 28, 1980 [JP] Japan ................................. 55-23391

[51] Int. Cl.$^3$ .................... H01L 23/48; H01L 23/28; H01L 29/46; H01L 29/62
[52] U.S. Cl. ........................................ 357/71; 357/17; 357/65; 357/67; 357/72; 420/427
[58] Field of Search ................ 357/65, 67, 17, 71, 357/72; 420/427

[56] References Cited

U.S. PATENT DOCUMENTS

| 896,705 | 8/1906 | Von Bolton | 420/427 X |
| 1,023,315 | 4/1912 | Hunter | 420/427 X |
| 3,379,520 | 4/1968 | Chang et al. | 420/427 |
| 3,675,090 | 7/1972 | Neale | 357/65 X |
| 3,701,931 | 10/1972 | Revitz et al. | 357/67 X |

FOREIGN PATENT DOCUMENTS 53-110460 of 1978 Japan ................................. 420/427
54-11689 1/1979 Japan ................................. 357/67

OTHER PUBLICATIONS

Electrochem. Soc., vol. 122, No. 8, pp. 1152-1154, "Modified Contact Metallizations for GaP to Provide Barrier Action Against Gallium Migration", by W. A. Brantley et al.; 1975.

Primary Examiner—Andrew J. James
Assistant Examiner—Seth M. Nehrbass
Attorney, Agent, or Firm—Oblon, Fisher, Spivak, McClelland & Maier

[57] ABSTRACT

Disclosed is a III-V Group compound semiconductor light-emitting element having a III-V Group compound semiconductor body with a p-n junction and including a p-type layer involved in forming the p-n junction; and a multi-layer electrode mounted on the p-type layer of the semiconductor body. The electrode comprises a first layer of gold alloy containing a small amount of beryllium or zinc and formed in direct contact with the p-type layer of the semiconductor body and an uppermost layer formed of gold or aluminum. A tantalum layer doped with carbon, nitrogen and/or oxygen is formed between the first layer and the uppermost layer by means of vacuum vapor deposition.

5 Claims, 9 Drawing Figures

F I G. 3
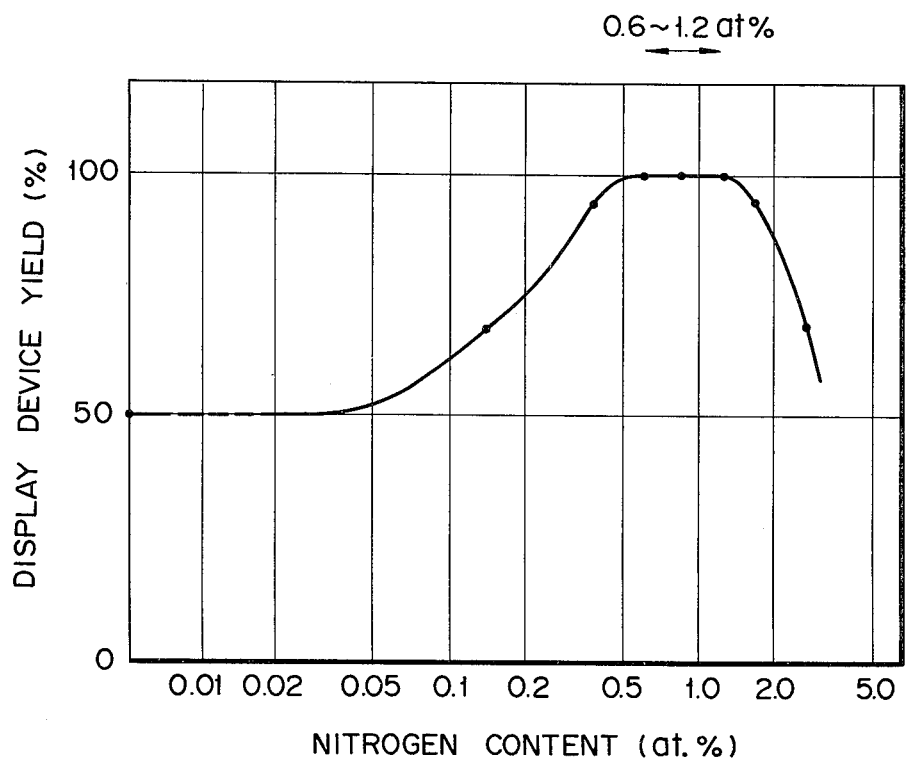

III-V GROUP COMPOUND SEMICONDUCTOR LIGHT-EMITTING ELEMENT HAVING A DOPED TANTALUM BARRIER LAYER

BACKGROUND OF THE INVENTION

1. Field of the Invention

This invention relates to a III-V Group compound semiconductor light-emitting element and, more particularly, to a light-emitting element in which an improved electrode with a multi-layer structure is mounted on the surface of a p-type semiconductor layer involved in forming the p-n junction of the light-emitting element.

2. Description of the Prior Art

Compound semiconductors are widely used for the production of light-emitting elements. Particularly, a light-emitting diode utilizing gallium phosphide (GaP), which is a typical III-V Group compound semiconductor emits light of desired colors ranging from red to green depending on the kind of impurity added thereto. It is, therefore, attracting increased attention in this field.

In general, a GaP light-emitting diode is known which comprises an n-type GaP substrate, an n-type GaP layer formed on the substrate, and a p-type GaP layer formed on the n-type GaP layer, a p-n junction being formed between the n-type and p-type GaP layers. Electrodes are mounted on the upper surface of the p-type GaP layer and on the lower surface of the substrate, respectively. The diode of this structure is mounted on a header by using a conductive paste such that the electrode mounted on the substrate is fixed to the conductive paste. Also, the electrode mounted on the p-type GaP layer is connected to the terminal of the header via a lead wire.

It is necessary for the electrode mounted on the p-type layer to meet various requirements including the following:

(a) The electrode should be brought into ohmic contact with the p-type layer and the contact resistance should be small.

(b) The lead wire should be easily bondable to the electrode.

(c) The electrode should not decrease the light-emitting efficiency of the diode.

(d) The electrode should withstand a strong acid used for etching the p-n junction region damaged by dicing.

(e) The electrode should permit fine processing.

However, an electrode meeting all of these requirements has not yet been developed. Specifically, an electrode with a two-layer structure consisting of a first metal layer formed of a gold alloy containing 1 to 2% by weight of beryllium or zinc, said first metal layer being formed on the p-type GaP layer, and a second metal layer consisting of gold and formed on the first metal layer is known to meet requirement (a) mentioned above. The prior art electrode mentioned certainly meets requirement (d) as well and requirement (e) to some extent, but fails to meet requirements (b) and (c).

Concerning requirements (b) and (c), it should be noted that the two metal layers formed on the p-type layer are selectively removed so as to provide a pattern of electrodes and, then, subjected to heat treatment to achieve an ohmic contact between the electrode and the p-type layer. During the heat treatment, gallium and phosphorus atoms, particularly gallium atoms contained in the p-type layer, are allowed to migrate through the first metal layer (alloy layer) so as to be deposited on the surface of the second metal layer (gold layer). In addition, beryllium or zinc atoms contained in the first metal layer also migrate so as to be deposited on the gold layer surface. As a result, the atoms deposited on the gold layer surface form a film of complex oxides; e.g., Ga-P-Be-O or Ga-P-Zn-O, which is hard to etch away. The oxide film impairs the bonding property of the electrode to the lead wire so much that the bonding operation must be repeated four or five times to achieve the desired bonding.

Further, the gallium atom migration mentioned above results in changes in the GaP crystal structure, leading to decreased light-emitting efficiency of the diode. The difficulty can not be overcome even if the upper gold layer of the electrode is thickened because the gallium atom diffusion coefficient is larger in gold (increase in gold layer thickness simply results in an increase in the gallium atom storage volume).

To overcome the above-noted drawbacks of the prior art, it has been proposed to form an intermediate metal layer between the first and second metal layers. For example, it has been proposed to provide an intermediate layer formed of a metal having a high melting point such as molybdenum in Japanese Patent Application Disclosure No. 53-110460 disclosed to the public on Sept. 27, 1978. It has also been proposed to provide an intermediate layer formed of Ta, W or Nb in Japanese Patent Application Disclosure No. 54-11689 disclosed to the public on Jan. 27, 1979. However, even these techniques leave room for further improvement.

SUMMARY OF THE INVENTION

This invention is intended to provide a III-V Group compound semiconductor light-emitting element having an improved electrode and a method of producing the same. The electrode mentioned permits suppressing the migration of atoms from within the semiconductor region or electrode itself to the uppermost surface of the electrode, with the result that the bonding property of the electrode is improved and, at the same time, the light-emitting efficiency of the element is not lowered.

According to this invention, there is provided a light-emitting element, comprising:

a III-V Group compound semiconductor body having a p-n junction and including a p-type layer involved in forming said p-n junction; and a multi-layer electrode mounted on the p-type layer and comprising a first layer formed of a gold alloy containing a small amount of beryllium or zinc and provided in direct contact with the p-type layer, a second layer provided on the first layer and formed of tantalum doped with at least one element selected from the group consisting of carbon, nitrogen and oxygen, and a third layer provided on the second layer and formed of gold or aluminum.

Each layer of the multi-layer electrode is formed according to the invention by means of vacuum vapor deposition. In this invention, the doped tantalum layer (second layer) is particularly important. In general, the second layer is formed by vapor deposition of tantalum under a reduced pressure dopant source atmosphere. Where the tantalum layer is doped with carbon alone, methane gas or acetylene gas is introduced into the tantalum vapor deposition chamber. Ammonia or nitrogen gas are used as the dopant source of nitrogen. Likewise, oxygen gas is used as the dopant for the tantalum layer with oxygen alone. The gaseous sources which are used together to dope the tantalum layer contain at least two of the following: carbon, nitrogen and oxygen. If both carbon and oxygen are doped into the tantalum layer, carbon dioxide gas may be used.

The doped tantalum layer (second layer) acts as a barrier layer against gallium and phosphorus atoms coming from the p-type layer of the semiconductor body as well as beryllium or zinc atoms coming from the first alloy layer of the electrode. Thus, these atoms are not allowed to migrate into the third layer (uppermost layer). Naturally, a complex oxide film as mentioned with respect to the prior art is not formed on the uppermost surface of the electrode, leading to an improved bonding property of the electrode to the lead wire. In addition, the doped tantalum layer, even if formed relatively thin, sufficiently exhibits the barrier effect mentioned above. Thus, the first alloy layer can also be made very thin for the sole purpose of making ohmic contact, due to the barrier effect of the doped tantalum layer which renders it possible to maintain high light-emitting efficiency of the light-emitting element.

Of course, the multi-layer electrode induced in the light-emitting element of this invention also satisfies requirements (a), (d) and (e) mentioned previously.

BRIEF DESCRIPTION OF THE DRAWINGS

FIGS. 2 to 4 are graphs each showing the relationship between the yield of display devices using light-emitting elements and the dopant concentration of the tantalum layer included in the multi-layer electrode of the light-emitting element.

DETAILED DESCRIPTION OF THE PREFERRED EMBODIMENTS

FIGS. 1A to 1F collectively show how to produce a light-emitting element of this invention utilizing a III-V Group compound semiconductor, particularly, GaP.

Figure 1A:
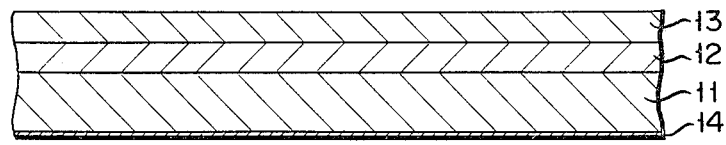
FIGS. 1A to 1F are cross sectional views collectively showing the steps of producing a light-emitting element according to one embodiment of this invention.

FIG. 1A shows that an n-type GaP layer 12 and a p-type GaP layer 13 are successively formed by, for example, an ordinary liquid phase epitaxial growth method on one main surface of an n-type GaP substrate 11. The n-type layer 12 and the n-type substrate 11 are each doped with a donor impurity, e.g. tellurium, at a concentration of about 2 to $10 \times 10^{17}$ atoms/cm$^3$. For producing, for example, a red-emitting element, the p-type layer 13 is doped with zinc and oxygen collectively serving to form a light-emitting center, the total concentration of zinc and oxygen being about 1 to $5 \times 10^{17}$ atoms/cm$^3$. (The term "semiconductor body" as used herein and in the claims is intended to mean a semiconductor substrate having a semiconductor layer or layers integrally formed therewith. For example, a III-V Group compound semiconductor body comprises the substrate 11, the n-type layer 12 and the p-type layer 13. If the n-type layer 11 is not formed, the semiconductor body comprises an n-type substrate and a p-type layer directly formed thereon.) Then, a gold alloy layer 14 containing a small amount of germanium or silicon is formed by vapor deposition on the other main surface of the substrate 11.

Figure 1B:
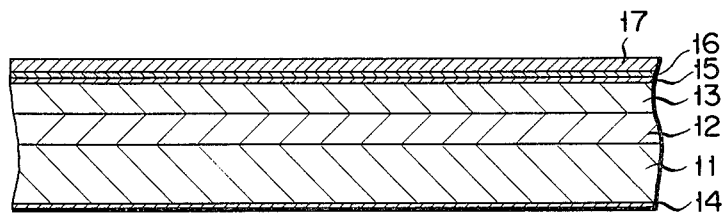

Further, a multi-layer electrode is formed on the p-type GaP layer 13 constituting the uppermost layer of the structure as shown in FIG. 1A. To form the electrode, a gold alloy layer 15, a doped tantalum layer 16 and a gold or aluminum layer 17 are successively formed on the p-type GaP layer 13 as shown in FIG. 1B. The gold alloy layer 15, which contains a small amount, 1 to 2% by weight in general, of beryllium or zinc and is as thin as about 0.1 to 0.4 $\mu$m, is formed by means of vapor deposition under a vacuum of, in general, $10^{-6}$ to $10^{-8}$ torr. The tantalum layer 16 is doped with carbon, nitrogen and/or oxygen and is relatively thin, e.g., about 0.2 to 0.4 $\mu$m thick. To form the doped tantalum layer 16, the semiconductor body bearing the gold alloy layer 15 is put in a sealed vapor deposition apparatus (not shown) housing a tantalum source and evacuated in advance to a vacuum of about $10^{-7}$ to $10^{-8}$ torr, followed by introducing a dopant source into the apparatus such that the interior pressure of the apparatus is increased to about $10^{-4}$ to $10^{-5}$ torr. Under this condition, the tantalum source housed in the apparatus is heated and evaporated so as to form the desired doped tantalum layer.

When the tantalum layer 16 is doped with carbon, methane gas, acetylene gas, etc. can be used as the dopant source. To dope the layer 16 with nitrogen, ammonia gas, nitrogen gas, etc. can be used as the dopant source. When it comes to oxygen-doping, oxygen gas, etc. can be used as the dopant source. Of course, these dopant sources can be used in combination. In addition, carbon dioxide can be used to dope the tantalum layer 16 with both carbon and oxygen.

The concentration of the dopant in the tantalum layer 16 is small but sufficient to suppress the migration of atoms (e.g., Ga, P, Be, Zn) coming from the underlying layer or layers during the heat treatment as hereinafter described. Particularly, in order to improve bondability to a lead wire of the gold or aluminum layer 17 subsequently formed on the tantalum layer 16, the dopant concentration should preferably be 0.5 to 2.0 atomic % for the carbon-doping, 0.6 to 1.2 atomic % for the nitrogen-doping, and 0.8 to 2.0 atomic % for the oxygen-doping.

The gold or aluminum layer 17, which is relatively thin, e.g., 0.2 to 1 $\mu$m thick, is formed by an ordinary vapor deposition technique under a vacuum of $10^{-6}$ to $10^{-8}$ torr. After formation of the layer 17, a heat treatment is applied to the structure at, for example, 480° to 520° C. for 10 to 30 minutes for bringing the alloy layers 14 and 15 into ohmic contact with the substrate 11 and the p-type layer 13, respectively, and for sufficiently bonding the metal layers to each other.

Figure 1C:
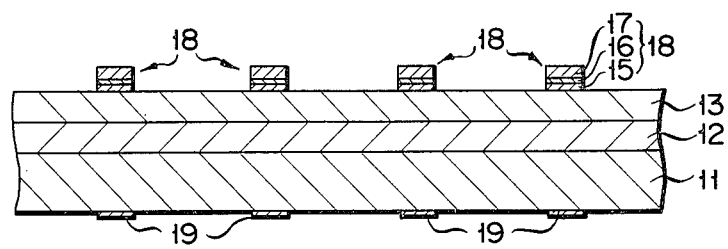

Then, the metal layers 15 to 17 are selectively etched away so as to form a multi-layer electrode 18 on the p-type layer 13 as shown in FIG. 1C. Specifically, a resist layer (not shown) is selectively formed first on the metal layer 17, followed by selectively etching the metal layer 17 with the resist layer used as a mask. An aqueous solution containing iodine and potassium iodide is used as the etchant in this step. Then, the doped tantalum layer 16 is selectively etched with the remaining metal layer 17 used as the mask. An alkaline etchant e.g., an aqueous solution containing 9 parts by weight of sodium hydroxide and 1 part by weight of potassium hydroxide, is used for selectively etching the layer 16 Finally, the gold alloy layer 15 is selectively etched with the remaining tantalum layer 16 used as the mask so as to form the desired electrode 18 on the p-type layer 13. The etchant used for etching the uppermost layer 17 can also be used for etching the alloy layer 15 Since a heat treatment is applied in advance, as mentioned previously, the doped tantalum layer 16 is no peeled from the alloy layer 15 during the etching step. After forming the electrode 18, the alloy layer 14 formed on the substrate 11 is also selectively etched so as to form an electrode 19 (see FIG. 1C).

Figure 1D:
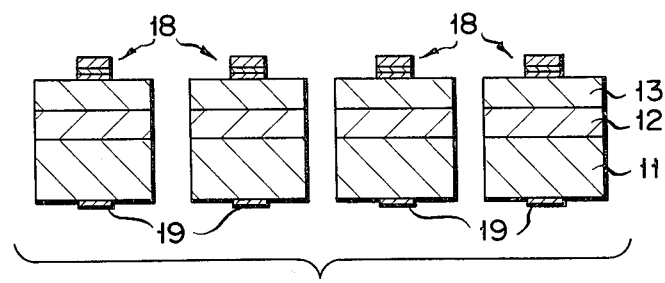

The resultant wafer shown in FIG. 1C is cut into pellets by an ordinary scribing and dicing technique as shown in FIG. 1D. It should be noted that the light-emitting region, i.e., the p-n junction region, of the semiconductor body is damaged in the cutting step, leading to a reduction in the light-emitting efficiency of the resultant element. In order to overcome the difficulty, the cut surfaces of the pellet are roughened so as to remove the damaged p-n junction region. The roughening treatment also serves to facilitate the emission of light from the element to the outside, leading to an improvement of the light-emitting efficiency. For this purpose, the cut surfaces of the pellet are etched by a heated mixture of hydrochloric acid and nitric acid (see FIG. 1E).

The finished pellet thus obtained is mounted via a conductive paste, e.g., silver paste 20, on a TO header 21 such that the electrode 19 mounted on the n-type substrate 11 is fixed to the paste 20. Also, one end of a gold wire 24 is bonded to the multi-layer electrode 18, with the other end of the gold wire 24 connected to an external terminal 22. As seen from FIG. 1F, the TO header 21 is provided with another external terminal 23 of the opposite polarity. Finally, the entire pellet is sealed with, for example, epoxy resin 25, thereby producing a red-emitting element, as shown in FIG. 1F.

Incidentally, a green-emitting element can be obtained if the p-type GaP layer 13 is doped with nitrogen at a concentration of $1 \times 10^{17}$ to $5 \times 10^{18}$ atoms/cm$^3$ in place of zinc and oxygen.

As described in detail, the light-emitting element of this invention comprises an electrode 18 with a three-layer structure. It is particularly important to note that the electrode 18 comprises an intermediate tantalum layer 16 doped with carbon, nitrogen and/or oxygen. The particular construction mentioned permits a gold wire 24 to be bonded easily to the electrode 18 and, at the same time, enables the light-emitting element to exhibit a light-emitting efficiency very close to the theoretical value.

To be more specific, the doped tantalum layer 16 provides a barrier layer against the atoms of zinc, gallium, phosphorus, etc. contained in the semiconductor body and the underneath alloy layer 15, with the result that these atoms are prevented from migrating through the doped tantalum layer 16 to reach the surface of the uppermost gold or aluminum layer 17 in the heat treating step. Naturally, a complex oxide film is not formed on the surface of the gold or aluminum layer 17 and, thus, the gold wire 24 can be easily bonded to the electrode 18. Incidentally, the layer 16, even if formed of tantalum alone, certainly exhibits the abovenoted barrier effect. But, the barrier effect is markedly enhanced if the tantalum layer 16 is doped with at least one of carbon, nitrogen and oxygen. It is supposed that the dopant serves to densify the tantalum layer 16, rendering it substantially impossible for the gallium atoms, etc. to migrate through the layer 16. As a matter of fact, atoms of Zn, Ga, P, etc. are scarcely recognizable on the surface of the gold or aluminum layer 17 when analyzed with an ion microanalyzer (IMA).

As described above, migration of gallium atoms, in particular, is prevented by the doped tantalum layer 16. Thus, change in crystal structure is not brought about in the surface region of the p-type GaP layer 13, resulting in that the produced light-emitting element can exhibit a light-emitting efficiency very close to the theoretical value, as mentioned previously. It should also be noted that variation in light-emitting efficiency among the produced pellets is very small, even if the temperature in the heat treating step varies somewhat from lot to lot, leading to a high yield of the light-emitting elements.

The embodiment described above is directed to a GaP light-emitting element. However, this invention can also be applied to other III-V Group compound semiconductor light-emitting elements, e.g., GaAs light-emitting element.

EXAMPLE

Figure 1E:
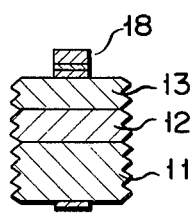
Figure 1F:
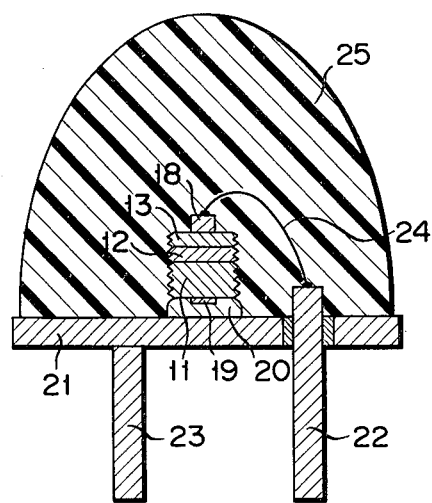

Light-emitting pellets as shown in FIG. 1E were prepared, with the dopant concentration of the tantalum layer 16 varied so as to examine the effect of the dopant concentration on the bonding property of the multi-layer electrode 18. Then, a gold wire was bonded to the electrode 18 of the pellet by a single bonding operation so as to prepare a segment for an hour-minute display device of a watch. Further, hour-minute display devices were prepared by using the segments, each display device comprising 30 segments.

Figure 2:
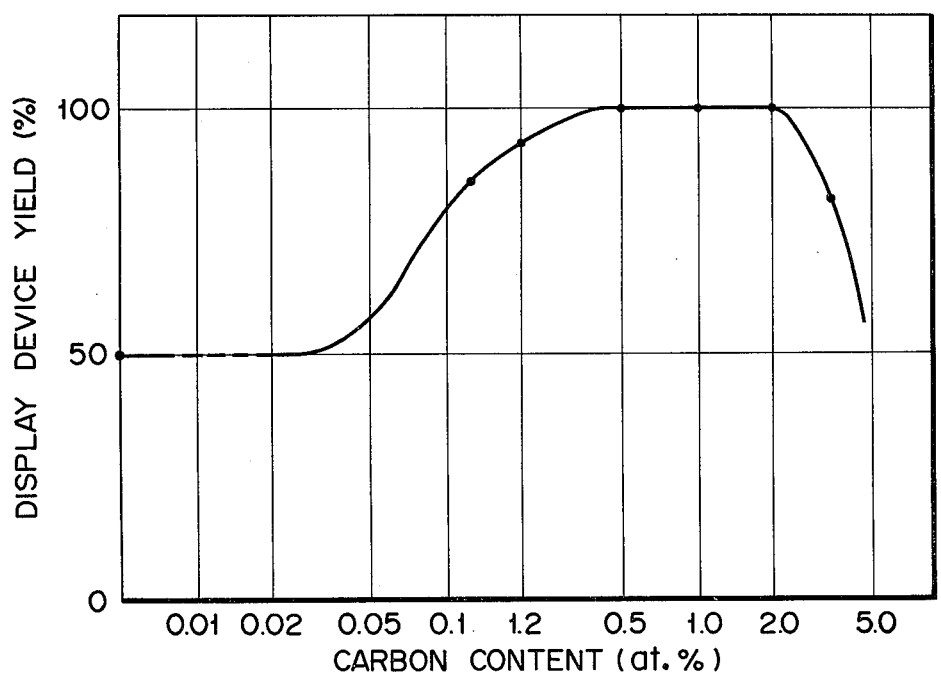
Figure 4:
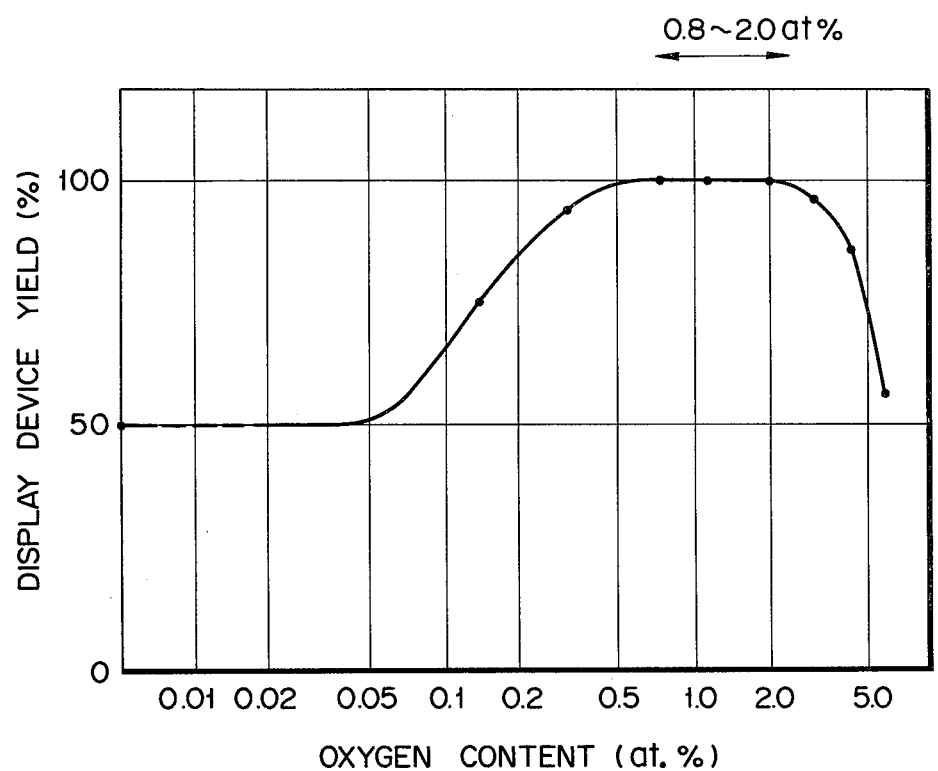

FIGS. 2 to 4 show the yields of the display devices as percentage of satisfactory devices based on all devices produced. Only display devices rendered unsatisfactory because of unsatisfactory bonding of the gold wire to the electrode 18, were actually counted as unsatisfactory. In other words, the devices rendered unsatisfactory by all other causes were regarded as satisfactory for the purposes of FIGS. 2 to 4. It should also be noted that display devices were counted as unsatisfactory 7 as long as one of the 30 segments included therein was unsatisfactory.

FIG. 2 shows that the tantalum layer doped with 0.5 to 2.0 atomic % of carbon serves to eliminate completely the unsatisfactory bonding of the gold wire to the electrode 18. Also, FIGS. 3 and 4 respectively show that 0.6 to 1.2 atomic % of nitrogen concentration and 0.8 to 2.0 atomic % of oxygen concentration completely eliminate unsatisfactory bonding. In the above measurements the dopant concentration was determined by IMA.

What is claimed as new and desired to be secured by Letters Patent of the United States is:

1. A light-emitting element comprising:
    a III-V Group compound semiconductor body having a p-n junction and including a p-type layer involved in forming said p-n junction; and
    a multi-layer electrode mounted on the p-type layer; said electrode including
    a first layer formed of a gold alloy containing a small amount of a metal selected from the group consisting of beryllium and zinc; said first layer being formed in direct contact with the p-type layer;
    a second layer formed on the first layer and made of tantalum doped with at least one dopant selected from the group consisting of the elements carbon, nitrogen and oxygen, and a mixture of at least two of said elements, said elements present in an amount between 0.5–2.0, 0.6–1.2 and 0.8–2.0 atomic %, respectively; and
    a third layer formed on the second layer and made of a metal selected from the group consisting of gold and aluminum.

2. The element according to claim 1, wherein the first layer of the multi-layer electrode contains 1 to 2% by weight of beryllium.

3. The element according to claim 1, wherein the tantalum layer is about 0.2 to 0.4μ thick.

4. The element according to claim 3, wherein the III–V Group compound semiconductor is gallium phosphide.

5. The element according to claim 1 wherein the first layer of the multi-layered electrode contains 1 to 2% by weight of zinc.

* * * * *